(12) United States Patent
Chen et al.

(10) Patent No.: US 8,994,103 B2
(45) Date of Patent: Mar. 31, 2015

(54) HIGH VOLTAGE METAL-OXIDE-SEMICONDUCTOR TRANSISTOR DEVICE AND MANUFACTURING METHOD THEREOF

(71) Applicant: United Microelectronics Corp., Hsin-Chu (TW)

(72) Inventors: Wei-Lin Chen, Changhua County (TW); Tseng-Hsun Liu, Taipei (TW); Kuan-Yu Chen, New Taipei (TW); Chiu-Ling Lee, Hsinchu (TW); Chiu-Te Lee, Hsinchu County (TW); Chih-Chung Wang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/938,252

(22) Filed: Jul. 10, 2013

(65) Prior Publication Data

US 2015/0014768 A1 Jan. 15, 2015

(51) Int. Cl.
*H01L 29/66* (2006.01)
*H01L 29/78* (2006.01)

(52) U.S. Cl.
CPC ...... *H01L 29/7816* (2013.01); *H01L 29/66681* (2013.01); *H01L 29/66704* (2013.01); *H01L 29/7825* (2013.01)

USPC .............. 257/335; 257/E29.242; 257/E29.02; 438/296

(58) Field of Classification Search
CPC ............ H01L 29/0634; H01L 29/0649; H01L 29/42368; H01L 29/66681; H01L 29/7816; H01L 29/7817
USPC .............. 257/335, E29.242, E29.02; 438/286
See application file for complete search history.

(56) References Cited

U.S. PATENT DOCUMENTS

| | | | |
|---|---|---|---|
| 7,297,604 B2 * | 11/2007 | Shin et al. | 438/296 |
| 8,357,986 B2 | 1/2013 | Wang et al. | |
| 8,575,692 B2 * | 11/2013 | Yang et al. | 257/335 |
| 2012/0280317 A1 * | 11/2012 | Lee et al. | 257/335 |
| 2012/0313166 A1 | 12/2012 | Ito | |
| 2013/0026565 A1 | 1/2013 | Verma et al. | |

* cited by examiner

*Primary Examiner* — Trung Q Dang
(74) *Attorney, Agent, or Firm* — Winston Hsu; Scott Margo

(57) ABSTRACT

A lateral double-diffused metal-oxide-semiconductor transistor device includes a substrate having at least a shallow trench isolation formed therein, an epitaxial layer encompassing the STI in the substrate, a gate, and a drain region and a source region formed in the substrate at respective two sides of the gate. The epitaxial layer, the source region and the drain region include a first conductivity type. The gate includes a first portion formed on the substrate and a second portion extending into the STI.

20 Claims, 5 Drawing Sheets

HIGH VOLTAGE METAL-OXIDE-SEMICONDUCTOR TRANSISTOR DEVICE AND MANUFACTURING METHOD THEREOF

BACKGROUND OF THE INVENTION

1. Field of the Invention

The invention relates to a high voltage metal-oxide-semiconductor (herein after abbreviated as HV MOS) transistor device and a manufacturing method thereof, and more particularly, to a high voltage lateral double-diffused metal-oxide-semiconductor (HV-LDMOS) transistor device and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantages of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dopant concentration and large area. The drift region is used to alleviate the high voltage between the drain and the source, therefore the LDMOS transistor device can have high breakdown voltage (BVD).

It is well-known that characteristics of low ON-resistance (hereinafter abbreviated as $R_{ON}$) and high breakdown voltage are always required to the HV MOS transistor device. However, breakdown voltage and $R_{ON}$ are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a LDMOS transistor device is provided. The LDMOS transistor device includes a substrate having at least a shallow trench isolation (hereinafter abbreviated as STI) formed therein, an epitaxial layer encompassing the STI in the substrate, a gate, and a drain region and a source region formed in the substrate at respective two sides of the gate. The epitaxial layer, the source region and the drain region include a first conductivity type. The gate includes a first portion formed on the substrate and a second portion extending into the STI.

According to the claimed invention, another LDMOS transistor device is provided. The LDMOS transistor device includes a substrate having at least a shallow trench isolation (STI) formed therein, an epitaxial layer encompassing the STI in the substrate, a gate, and a drain region and a source region formed in the substrate at respective two sides of the gate. The epitaxial layer, the drain region, and the source region include a first conductivity type.

According to the claimed invention, a method for manufacturing a LDMOS transistor device is provided. According to the method, a substrate having a shallow trench formed therein is provided. An epitaxial layer having a first conductivity type is formed to cover a surface of the shallow trench. After forming the epitaxial layer, a first insulating material is formed on the epitaxial layer and the shallow trench is filled up with the first insulating material. Consequently, a STI is formed. Next, a recess is formed in the STI, and the first insulating material is exposed in the recess. After forming the recess, a gate dielectric layer is formed on the substrate. Then a gate conductive layer is formed in the recess and followed by filling the recess with a second insulating material.

According to the LDMOS transistor device and the manufacturing method thereof, the epitaxial layer is formed to encompass the STI, therefore, a current path, which is formed during operation, is forced to be closer to the edge of the STI. Consequently, a channel region having very low resistance is resulted. Furthermore, the gate is formed to extend into the bottom of the STI, and thus Ron and breakdown voltage are both improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method for manufacturing a LDMOS transistor device provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
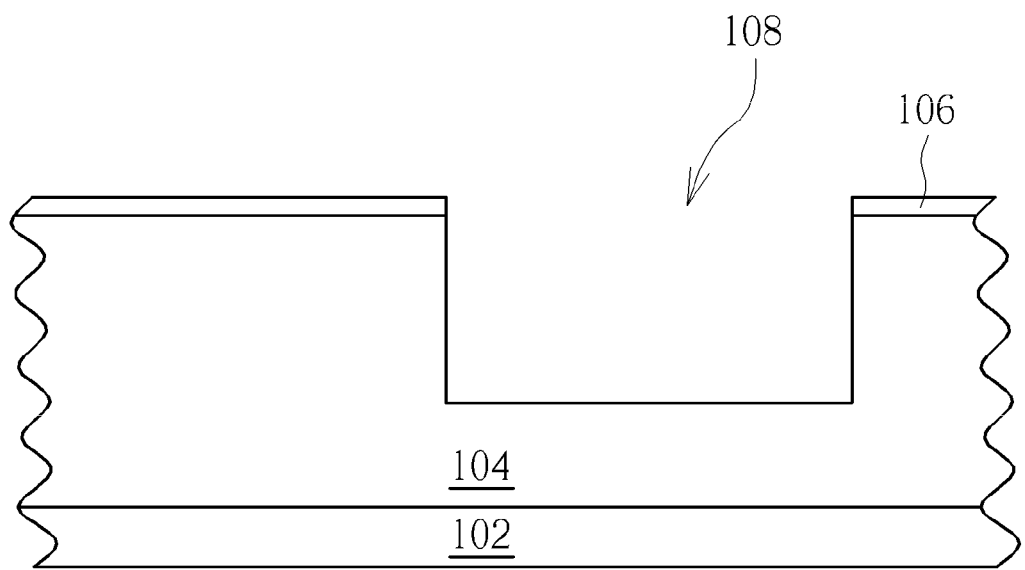

FIGS. 1-8 are schematic drawings illustrating a method for manufacturing a LDMOS transistor device provided by a preferred embodiment of the present invention. As shown in FIG. 1, a substrate 102, such as a silicon substrate, is provided. A deep well 104 is formed in the substrate 102. The deep well 104 includes a first conductivity type while the substrate 102 includes a second conductivity type. The first conductivity type and the second conductivity type are complementary to each other. In the preferred embodiment, the first conductivity type is an n type and the second conductivity type is a p type. Then, a pad oxide layer 106 and a patterned hard mask (not shown) for defining placement and size of a plurality of isolation structures are sequentially formed on the substrate 102. Next, the pad oxide layer 106 and substrate 102 are etched with the patterned hard mask serving as an etching mask. Consequently, a plurality of shallow trenches 108 are formed in the substrate 102.

Figure 2:
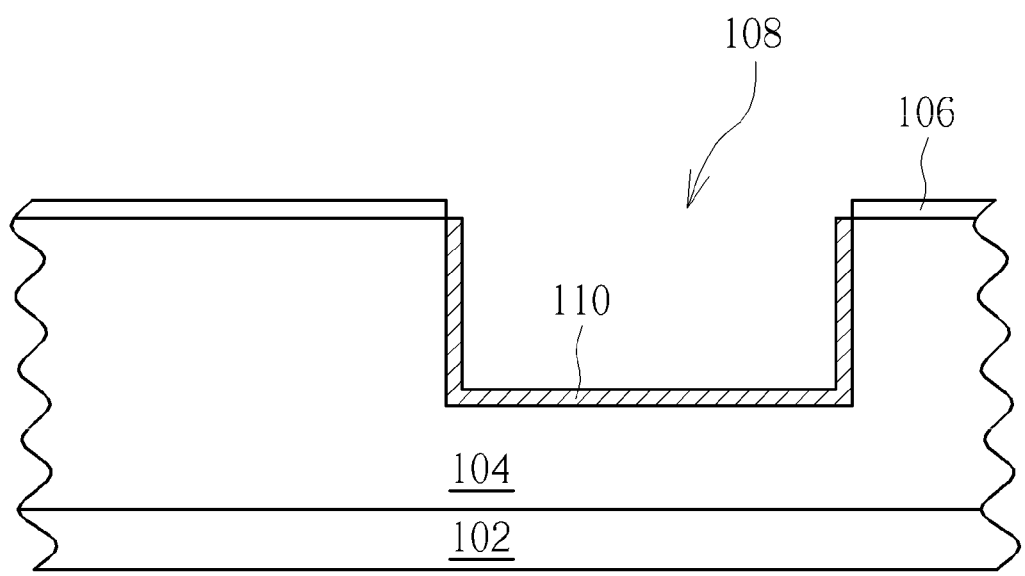

Please refer to FIG. 2. After forming the shallow trenches 106, an epitaxial layer 110 is formed on inner surface of the shallow trench 108. In the preferred embodiment, the epitaxial layer 110 is formed by performing a selective epitaxial growth (SEG) method. It is noteworthy that since the epitaxial material grows from exposed Si-surface during the SEG method, the sidewalls and bottoms surface of the shallow trench 108 is covered by the epitaxial layer 110 as shown in FIG. 2. In the preferred embodiment, the epitaxial layer 110 preferably includes silicon and the first conductivity type. In other words, the epitaxial layer 110 provided by the preferred embodiment is an n-Si epitaxial layer.

Figure 3:
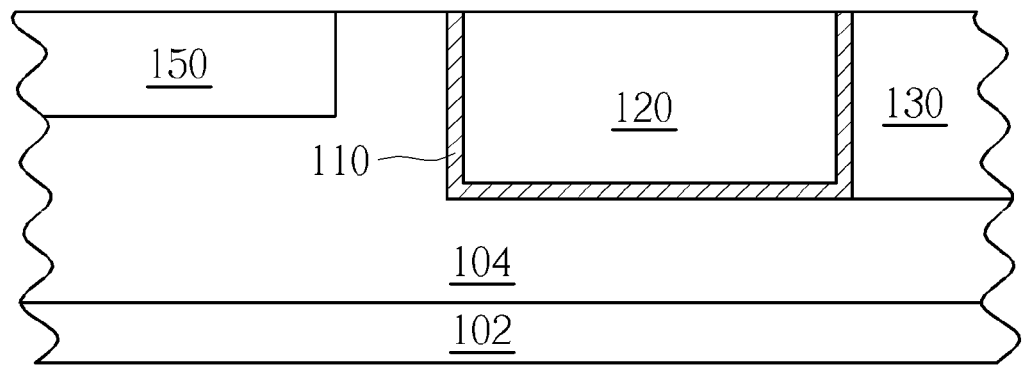

Please refer to FIG. 3. After forming the epitaxial layer 110, an insulating material is formed to fill up the shallow trenches 108 and followed by performing a planarization process. Consequently, superfluous insulating material and the pad oxide layer 106 are removed and a plurality of STIs 120 are for formed in the substrate 102. Some of the STIs 120 are used to provide electrical isolation between the LDMOS transistor device from other devices. As shown in FIG. 3, one STI 120 is formed in the deep well 104. More important, the STI 120 in the deep well 104 is encompassed by the epitaxial layer 110. In other words, the epitaxial layer 110 contacts the bottom and the sidewalls of the STI 120.

Please still refer to FIG. 3, after forming the STI 120, a first well region 130 and a second well region 150 are formed in the substrate 102. The first well region 130 includes the first conductivity type and the second well region 150 includes the second conductivity type in the preferred embodiment. Therefore, the first well region 130 is an n-well region and the second well region 150 is a p-well region. As shown in FIG. 3, the first well region 130 and the second well region 150 are all formed in the deep well 104 but spaced apart from each other. Furthermore, a dopant concentration of the deep well 104 is lower than a dopant concentration of epitaxial layer 110, and the dopant concentration of the epitaxial layer 110 is lower than a dopant concentration of the first well region 130.

Figure 4:
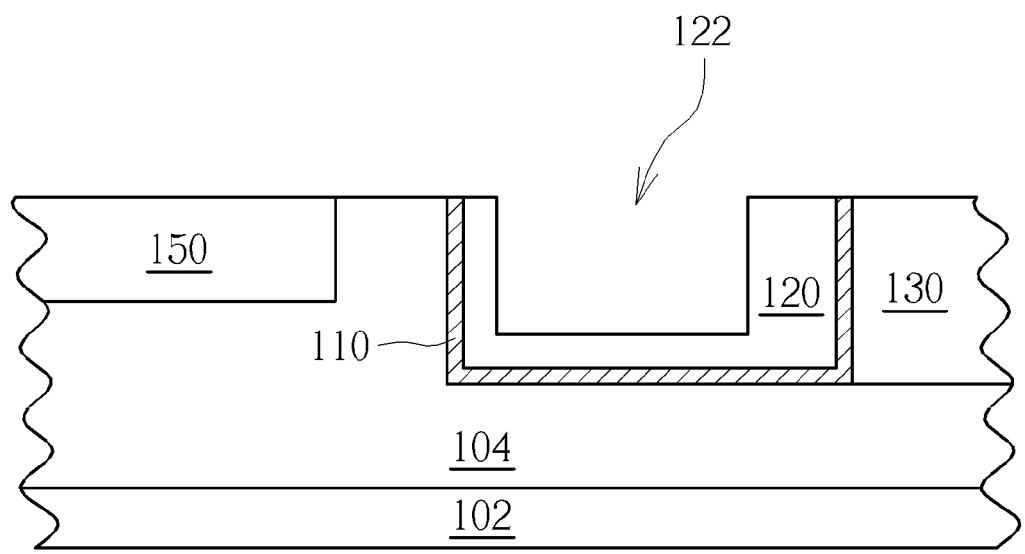

Please refer to FIG. 4. Next, an etch process is performed to remove a portion of the insulating material from the STI 120, and thus a recess 122 is formed in the STI 120. It is noteworthy that a width of the recess 122 is smaller than a width of the STI 120. Therefore, the insulating material of the STI 120 is exposed in the recess 122 as shown in FIG. 4.

Figure 5:
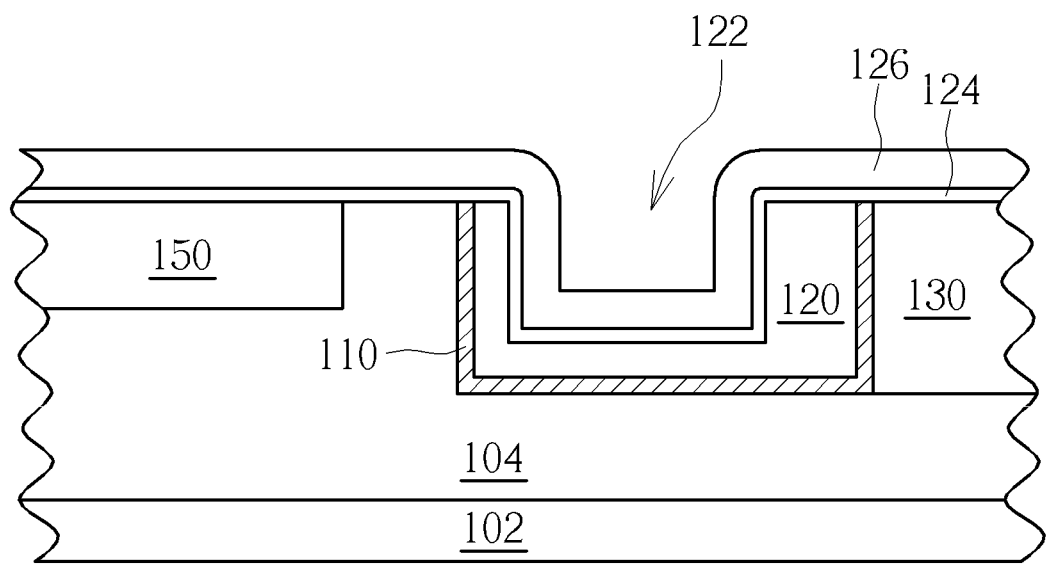
Figure 6:
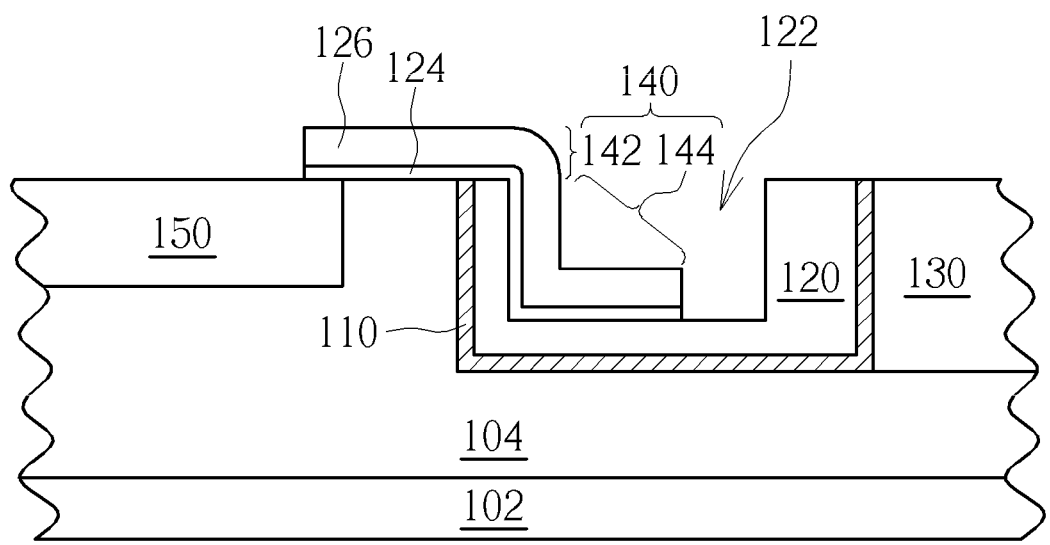

Please refer to FIGS. 5-6. After forming the recess 122 in the STI 120, an insulating layer 124 and a conductive layer, such as a polysilicon layer 126 are sequentially formed on the substrate 102. Next, the polysilicon layer 126 and the insulating layer 124 are patterned, and thus a gate 140 is obtained as shown in FIG. 6. It is noteworthy that the gate 140 includes a first portion 142 formed on the substrate 102 and a second portion 144 extending into the recess 122 in the STI 120. And the second portion 144 of the gate 140 covers a sidewall and a bottom of the STI 120. In the preferred embodiment, a length of the second portion 144 of the gate 140 is smaller than a width of the STI 120. However, the length of the second portion 144 of the gate 140 can be not only smaller than but also equal to the width of the recess 122. Additionally, the gate 140 is electrically isolated from the epitaxial layer 110 by the STI 120. And a distance between the gate 140 and the epitaxial layer 110, that is the overall thickness of the insulating layer 124 and the STI 120 between the bottom of the recess 122 and the epitaxial layer 110, and between the sidewall of the recess 122 and the epitaxial layer 110 are preferably the same, but not limited to this.

Furthermore, in another embodiment of the present invention, the epitaxial layer 110 is exposed by the recess 122. However, the gate 140 is still electrically isolated from the epitaxial layer 110 by the insulating layer 124.

Figure 7:
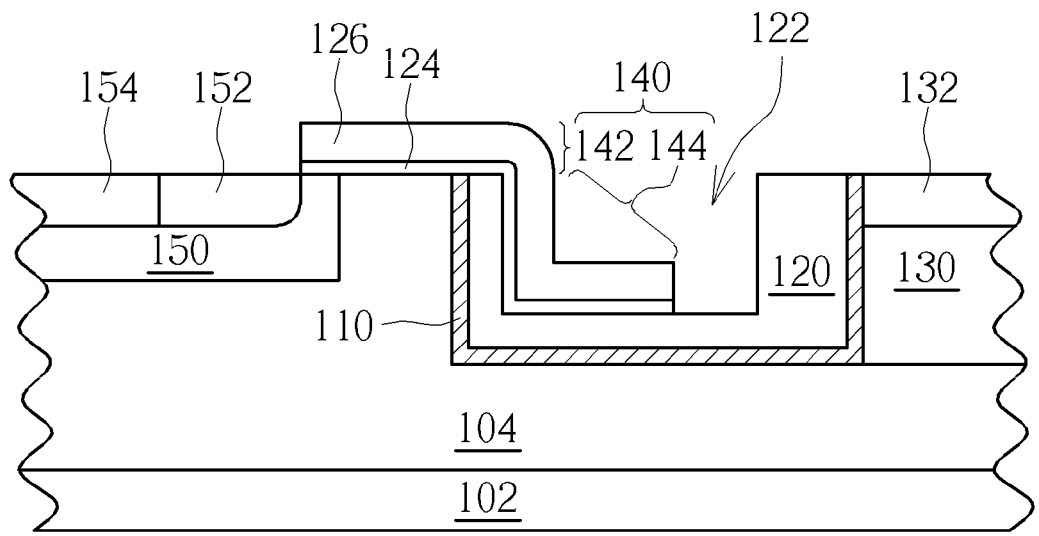

Please refer to FIG. 7. After forming the gate 140, a spacer (not shown) is formed on sidewalls of the gate 140. Next, a drain region 132, a source region 152, and a doped region 154 are formed in the substrate 102. As shown in FIG. 7, the drain region 132 is formed in the first well region 130 while the source region 152 and the doped region 154 are formed in the second well region 150. Furthermore, the source region 152 and the doped region 154 abut upon each other. According to the preferred embodiment, the drain region 132 and the source region 152 both include the first conductivity type and the doped region 154 includes the second conductivity type. Therefore, the preferred embodiment provides an n-drain region 132, an n-source region 152, and a p-doped region 154.

Figure 8:
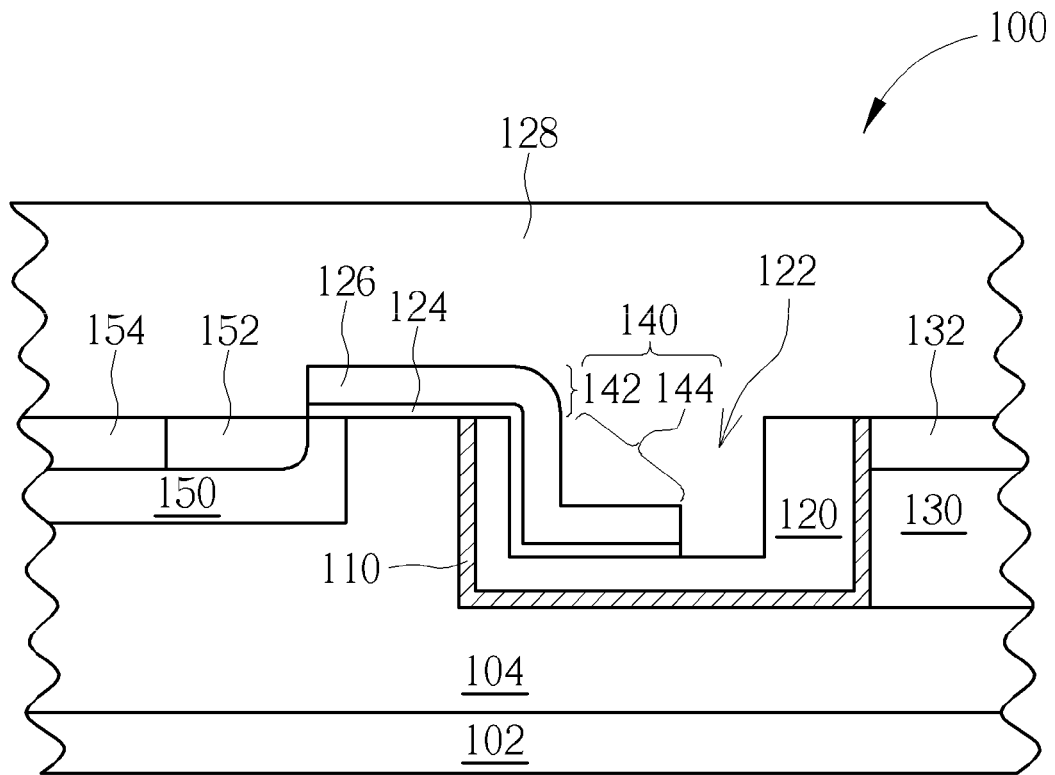

Please refer to FIG. 8. After forming the gate 130, another insulating material 128 is formed on the substrate 102. It is noteworthy that the recess 122 in the STI 120 is filled up with the insulating material 128. More important, the insulating material 128 serves as an interlayer dielectric (ILD) layer according to the preferred embodiment. Consequently, a LDMOS transistor device 100 is constructed and an even surface is obtained.

Figure 9:
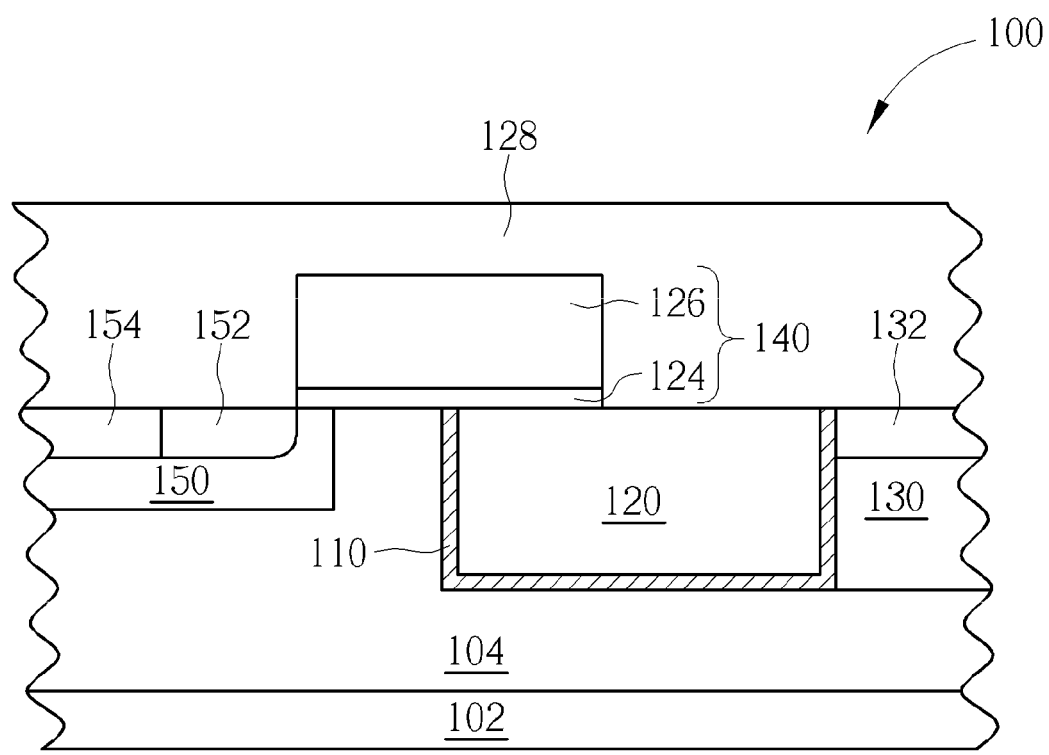
FIG. 9 is a schematic drawing illustrating a LDMOS transistor device provided by a modification to the preferred embodiment.

Please refer to FIG. 9, which is a schematic drawing illustrating a LDMOS transistor device provided by a modification to the preferred embodiment. Please note that elements the same in both of the preferred embodiment and the modification are designated by the same numerals. And those identical elements can include the same materials and conductivity types, therefore the related description is omitted for simplicity. More important, the modification is subsequent to forming the epitaxial layer, the STI, the first well region, and the second well region, thus FIG. 9 can be a schematic drawing in a step subsequent to FIG. 3. As shown in FIG. 9, after forming the epitaxial layer 110, the STI 120, the first well region 130, and the second well region 150, a gate including an insulating layer 124 and a conductive layer such as a polysilicon layer 126 is formed on the substrate 102. As shown in FIG. 9, the gate 140 is electrically isolated from the epitaxial layer 110 by the STI 120 and the insulating layer 124.

Please still refer to FIG. 9. Next, a spacer (not shown) is formed on sidewalls of the gate 140. Next, a drain region 132, a source region 152, and a doped region 154 are formed in the substrate 102, and thus a LDMOS transistor device 100 is obtained. Since the spatial relationship between those elements and conductivity types are all the same with those described in the aforementioned preferred embodiment, those details are omitted for simplicity. Then, the LDMOS transistor device 100 is covered and protected by an insulating material 128 formed on the substrate 102. As mentioned above, the insulating material 128 serves as an interlayer dielectric layer.

According to the LDMOS transistor device provided by the preferred embodiment, the epitaxial layer is formed to encompass the STI. Therefore, a current path, which is formed during operation, is forced to be closer to the edge of the STI. Consequently, a channel region having very low resistance is resulted. Furthermore, since the second portion of the gate is formed to extend into the bottom of the STI, Ron and breakdown voltage are both improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A lateral-diffusion metal-oxide-semiconductor (LDMOS) transistor device comprising:
   a substrate having at least a shallow trench isolation (STI) formed therein;

an epitaxial layer encompassing the STI in the substrate, the epitaxial layer comprising a first conductivity type, a thickness of the epitaxial layer is smaller than a thickness of the STI;

a gate comprising:
- a first portion formed on the substrate;
- a second portion extending into the STI; and a drain region and a source region having the first conductivity type formed in the substrate at respective two sides of the gate.

2. The LDMOS transistor device according to claim 1, further comprising a deep well formed in the substrate, and the deep well comprises the first conductivity type.

3. The LDMOS transistor device according to claim 2, further comprising a first well region having the first conductivity type formed the deep well, and the drain region is formed in the first well region.

4. The LDMOS transistor device according to claim 3, wherein a dopant concentration of the deep well is lower than a dopant concentration of epitaxial layer, and the dopant concentration of the epitaxial layer is lower than a dopant concentration of the first well region.

5. The LDMOS transistor device according to claim 2, further comprising a second well region and a doped region formed in the deep well, the second well region and the doped region comprise a second conductivity type.

6. The LDMOS transistor device according to claim 5, wherein the first conductivity type and the second conductivity type are complementary.

7. The LDMOS transistor device according to claim 5, wherein the source region and the doped region are formed in the second well region.

8. The LDMOS transistor device according to claim 1, wherein the epitaxial layer contacts a bottom and sidewalls of the STI.

9. The LDMOS transistor device according to claim 1, wherein the second portion of the gate covers at a sidewall of a bottom of the STI.

10. The LDMOS transistor device according to claim 9, wherein the second portion of the gate is electrically isolated from the epitaxial layer by the STI.

11. The LDMOS transistor device according to claim 1, wherein a length of the second portion of the gate is smaller than a width of the STI.

12. A lateral-diffusion metal-oxide-semiconductor (LDMOS) transistor device comprising:

a substrate having at least a shallow trench isolation (STI) formed therein;

an epitaxial layer encompassing the STI in the substrate, the epitaxial layer comprising a first conductivity type, a thickness of the epitaxial layer is smaller than a thickness of the STI;

a gate; and a drain region and a source region having the first conductivity type formed in the substrate at respective two sides of the gate.

13. The LDMOS transistor device according to claim 12, wherein the epitaxial layer contacts a bottom and sidewalls of the STI, and the gate is electrically isolated from the epitaxial layer by the STI.

14. A method for manufacturing a lateral-diffusion metal-oxide-semiconductor (LDMOS) transistor device, comprising:

providing a substrate having at least a shallow trench formed therein;

forming an epitaxial layer having a first conductivity type covering a surface of the shallow trench;

forming a first insulating material on the epitaxial layer and filling up the shallow trench to form a shallow trench isolation (STI);

forming a recess in the STI, and the first insulating material being exposed in the recess;

forming a gate dielectric layer on the substrate;

forming a gate conductive layer in the recess and on the substrate; and forming a second insulating material to fill the recess.

15. The method for manufacturing the LDMOS transistor device according to claim 14, wherein the epitaxial layer is formed by a selective epitaxial growth (SEG) method.

16. The method for manufacturing the LDMOS transistor device according to claim 14, wherein a width of the recess is smaller than a width of the STI.

17. The method for manufacturing the LDMOS transistor device according to claim 14, further comprising forming a first well region, a second well region, a doped region, a source region and a drain region in the substrate.

18. The method for manufacturing the LDMOS transistor device according to claim 17, wherein the source region, the drain region, and the first well region comprise the first conductivity type, the doped region and the second well region comprise a second conductivity type, and the first conductivity type and the second conductivity type are complementary.

19. The method for manufacturing the LDMOS transistor device according to claim 18, wherein a dopant concentration of the deep well is lower than a dopant concentration of epitaxial layer, and the dopant concentration of the epitaxial layer is lower than a dopant concentration of the first well region.

20. The method for manufacturing the LDMOS transistor device according to claim 17, wherein the drain region is formed in the first well region, and the source region and the doped region are formed in the second well region.

* * * * *